(12) United States Patent
Xiao et al.

(10) Patent No.: US 9,837,448 B2
(45) Date of Patent: Dec. 5, 2017

(54) ARRAY SUBSTRATE AND MANUFACTURING METHOD THEREOF AND DISPLAY APPARATUS

(71) Applicants: Boe Technology Group Co., Ltd., Beijing (CN); Beijing Boe Optoelectronics Technology Co., Ltd., Beijing (CN)

(72) Inventors: Zhilian Xiao, Beijing (CN); Haisheng Zhao, Beijing (CN); Chong Liu, Beijing (CN); Zhilong Peng, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/122,888

(22) PCT Filed: Jan. 21, 2016

(86) PCT No.: PCT/CN2016/071592
§ 371 (c)(1),
(2) Date: Aug. 31, 2016

(87) PCT Pub. No.: WO2017/028495
PCT Pub. Date: Feb. 23, 2017

(65) Prior Publication Data
US 2017/0179166 A1    Jun. 22, 2017

(30) Foreign Application Priority Data
Aug. 18, 2015   (CN) .......................... 2015 1 0506313

(51) Int. Cl.
*H01L 27/12*   (2006.01)
*H01L 27/02*   (2006.01)
(Continued)

(52) U.S. Cl.
CPC ...... *H01L 27/1244* (2013.01); *H01L 27/0288* (2013.01); *H01L 27/1296* (2013.01);
(Continued)

(58) Field of Classification Search
CPC ....... G02F 1/1362; H01L 27/02; H01L 27/12; H01L 29/10; H01L 29/66; H01L 29/786;
(Continued)

(56) References Cited

U.S. PATENT DOCUMENTS

| 8,461,582 B2 * | 6/2013 | Kimura | H01L 27/1214 257/347 |
| 2008/0185590 A1 * | 8/2008 | Kim | H01L 27/1214 257/72 |
| 2016/0209877 A1 * | 7/2016 | Chong | G06F 1/1652 |

FOREIGN PATENT DOCUMENTS

| CN | 101826534 | 9/2010 |
| CN | 103018991 | 4/2013 |

(Continued)

OTHER PUBLICATIONS

International Search Report and Written Opinion from PCT/CN16/71592 dated May 12, 2016.
(Continued)

*Primary Examiner* — Thanh T Nguyen
(74) *Attorney, Agent, or Firm* — Calfee, Halter & Griswold LLP

(57) ABSTRACT

The present invention relates to an array substrate, which comprises: a display region and a drive circuit region; the drive circuit region comprises GOA units, the GOA unit comprising a substrate, a gate electrode layer, an insulation
(Continued)

layer, an active layer and a source/drain electrode layer, and the drive circuit region further comprises a gate wire connecting to the gate electrode layer, and a source/drain layer wire at the same layer with the source/drain electrode layer, wherein the area between the portions of the gate wire and the source/drain layer wire which intercross with each other is only formed with the insulation layer. The invention further relates to a manufacturing method of an array substrate and a display apparatus comprising the array substrate.

15 Claims, 3 Drawing Sheets

(51) Int. Cl.
H01L 29/786 (2006.01)
H01L 29/66 (2006.01)
H01L 29/10 (2006.01)

(52) U.S. Cl.
CPC .... *H01L 29/1041* (2013.01); *H01L 29/66765* (2013.01); *H01L 29/78669* (2013.01)

(58) Field of Classification Search
CPC ........... H01L 29/78669; H01L 27/1244; H01L 27/3237; H01L 27/3244; H01L 27/0288; H01L 27/1296; H01L 29/66765; H01L 29/1041
See application file for complete search history.

(56) References Cited

FOREIGN PATENT DOCUMENTS

| | | |
|---|---|---|
| CN | 103730473 | 4/2014 |
| CN | 104637925 | 5/2015 |
| CN | 104658973 | 5/2015 |
| CN | 105093751 | 11/2015 |
| KR | 20150067564 | 6/2015 |

OTHER PUBLICATIONS

First Office Action for Chinese Patent Application No. 201510506313.9 dated Sep. 15, 2017.

* cited by examiner

ARRAY SUBSTRATE AND MANUFACTURING METHOD THEREOF AND DISPLAY APPARATUS

RELATED APPLICATIONS

The present application is the U.S. national phase entry of PCT/CN2016/071592, with an international filing date of Jan. 21, 2016, which claims the benefit of Chinese Patent Application No. 201510506313.9, filed on Aug. 18, 2015, the entire disclosures of which are incorporated herein by reference.

TECHNICAL FIELD

The present invention relates to the field of layout design of Gate Driver On Array or Gate On Array (GOA) units on a thin film transistor (TFT) substrate, and especially to an array substrate and a manufacturing method thereof and a display apparatus comprising it.

BACKGROUND

GOA technology is one kind of design in the TFT-LCD, which integrates the gate drive circuit of the LCD panel on the substrate, so as to improve integration level of the LCD panel and reduce the usage rate of the gate drive IC. GOA technology is therefore used broadly. However, there are some problems with the GOA on the TFT substrate in prior art, wherein it is found that ElectroStatic Discharge (ESD) defect usually occurs in the GOA circuit, which reduces the yield rate of the TFT substrate. The ESD defect is a main reason of Abnormal Display in various ADS products, resulting in a defect rate up to 4%.

SUMMARY

Various exemplary embodiments of the present inventive concepts are directed to an improved GOA circuit design, which solves the problem of GOA ElectroStatic Discharge, reduces the probability of abnormity of the display panel due to ESD. Specifically, the semiconductor pad layer mainly functions as a pad layer for climbing of the gate and source and does not function as a switch. However, the conductivity of the semiconductor material will be increased under high temperature, which is a key factor of inducing electrostatic. But in the processing of product, the film deposition process is performed under high temperature, the lowest one of which is 120° and the highest one of which is 360°, which is a important factor of the film deposition, and can not be changed. Therefore, embodiments of this invention reduce the probability of the ElectroStatic Discharge by altering the semiconductor pad layer in the causes of high occurrence and thus removing the active layer (that is Amorphous Silicon) in the drive circuit region connecting to the display area and the GOA units.

According to an aspect of the invention, an array substrate is proposed, which comprises a display region and a drive circuit region; the drive circuit region comprises a GOA unit, which comprise a substrate, a gate electrode layer, an insulation layer, an active layer and a source/drain electrode layer, and the drive circuit region further comprises a gate wire connecting to the gate electrode layer, and a source/drain layer wire at the same layer with the source/drain electrode layer, therein the area between the portions of the gate wire and the source/drain layer wire which intercross with each other is only formed with the insulation layer.

According to this technical solution, the area between the portions of the gate wire and the source/drain layer wire which intercross with each other does not have an active layer, that is, does not have a semiconductor material layer, so that eliminates the possibility of this area becoming a switch of thin film transistor, and thus largely reduces the probability of the ESD occurring at this area.

According to a preferable embodiment, the portions of the wires which intercross with each other are wider than the wires at surrounding area. This further reduces the probability of the ESD occurring at these portions.

According to a preferable embodiment, in an free area around the areas at which the wires which intercross with each other, a discharge-inducing region is formed, which region is formed with a dummy electrode portion at the same layer with the source/drain layer wire, a dummy electrode portion connecting to the gate wire, and an insulation layer and an active layer between the two dummy electrode portions. This preferable embodiment induces the static electricity possibly existing in surrounding active area to ESD in the discharge-inducing region, so that further reduces the probability of the ESD occurring at the active working area.

According to a preferable embodiment, the dummy electrode portion has a shape with a tip. The dummy electrode portion with a tip may further promote occurring of the ESD. According to a further preferable embodiment, the dummy electrode portion has a shape of triangle, rectangle or prismatic.

According to a preferable embodiment, the dummy electrode portion at the same layer with the source/drain layer wire and the dummy electrode portion connecting to the gate wire are two wires approximately extending parallel to each other, and the distance between the two wires is small enough to induce ESD.

According to a preferable embodiment, the dummy electrode portion has a weak area, which is easy to break off when an ESD event occurs. This preferable embodiment by arranging a weak area in the dummy electrode portion, can make the weak area directly to break off, that is to be burned out, when the ESD occurs in the discharge-inducing region, thus minimizes the effect of the ESD event.

According to another aspect of the invention, a manufacturing method of an array substrate is proposed, which comprises: providing a substrate; forming a gate electrode layer and a gate wire connecting to the gate electrode layer on the substrate; forming an insulation layer on the substrate formed with the gate electrode layer and the gate wire, which insulation layer covers the gate electrode layer and the gate wire; forming an active layer on the insulation layer; and forming a source/drain electrode layer and a source/drain layer wire on the substrate, wherein the active layer does not cover the area at which the gate wire and the source/drain wire intercross.

According to a preferable embodiment, the method further comprises: forming a discharge-inducing region in a free area around the gate wire and the source/drain layer wire, wherein a dummy electrode portion connecting to the gate wire is formed in the discharge-inducing region while the gate wire is formed, and a dummy electrode portion at the same layer with the source/drain layer wire is formed in the discharge-inducing region while the source/drain layer wire is formed, and the insulation layer and the active layer are formed between the two dummy electrode portions.

According to a preferable embodiment, the active layer consists of two layers of a-Si and $N^+$ a-Si material.

According to a preferable embodiment, the method further comprises a step of forming a passivation layer.

According to another aspect of the invention, a display apparatus is proposed, which comprises the array substrate as described above.

The embodiment of the invention reduces the occurrence rate of ESD, by altering the GOA unit design, especially improving the design of the intercross portions in the wire region.

BRIEF DESCRIPTION OF THE DRAWINGS

The figures are included to provide a further understanding of the embodiments and are incorporated into this specification and consists a part thereof. The figures illustrate embodiments and are used for explaining the principle of the embodiments with the description. It will be easily noted that, other embodiment and many expected advantages of the embodiments will be better understood by making reference to the following detailed description. The elements of the figures are not necessary drawn to scale. The same reference numbers refer to corresponding similar components.

DETAILED EMBODIMENTS

In the following detailed description, reference is made to the figures, which form a part of the detailed description and are shown by illustrative specific embodiments in which the invention can be employed. Therewith, the direction terms such as "top", "bottom", "left", "right", "upper" and "lower" etc. are used with reference to the orientation of the described figures. Since the components of the embodiments may be positioned in several different orientations, the direction terms are used for the purposes of illustration and by no means to limit. It should be understood that, other embodiments can be utilized or logic changes may be made without departing from the scope of the invention. Therefore, the following detailed description should not be employed in the sense of limiting, and the scope of the invention is defined by the attached claims.

Besides, the word "on" used with respect to a part, element or material layer formed or positioned "on" a surface can be used herein for representing the part, element or material layer "directly" being positioned (e.g. placed, formed, deposited etc.) on the implied surface, for example contacting with it directly. The word "above" used with respect to a part, element or material layer formed or positioned "above" a surface can be used herein for representing the part, element or material layer "indirectly" being positioned (e.g. placed, formed, deposited etc.) on the implied surface, and having one or more additional parts, elements or layers disposed between the implied surface and that part, element or material layer.

It should be understood that, the features of the various example embodiments described herein can be combined with each other, unless explicitly otherwise indicated.

In a regular display substrate, a display area and a GOA circuit drive area are connected by gate, source and drain circuits, and are referred as display region collectively. External signals are transmitted into the display region through metal wires and drive the display area to operation. After continuous research on defective products, it has been found that the areas at which the display region and the drive signal region connect, that is the areas at which the wires of the gates and the wires connecting to the source/drains intercross, easily generate ESD to cause electrostatic breakdown. Therefore, these areas are the weakest areas in the circuit, due to factors such as intensive wiring (due to the requirements of high PPI, narrow bezel, etc.), semiconductor pad layer and gate tip structure, etc.

Figure 1:
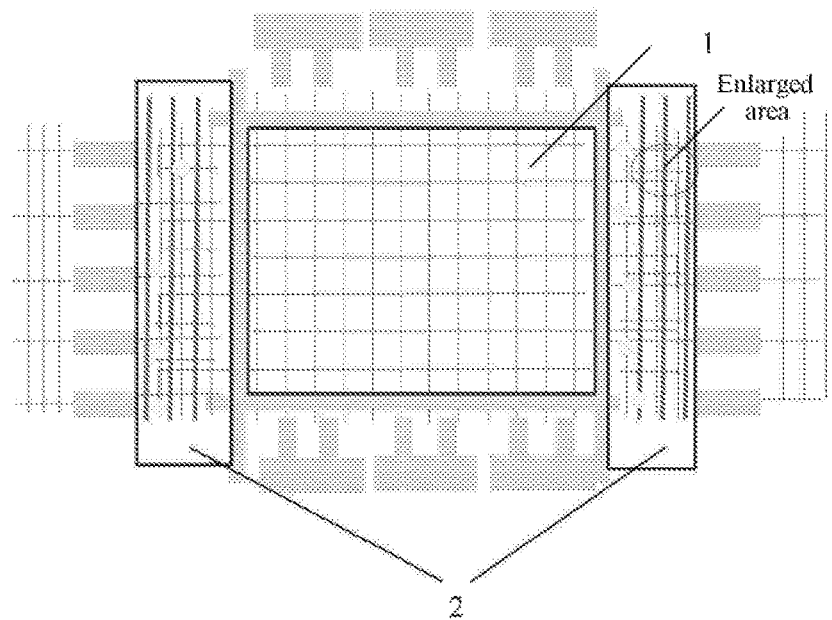
FIG. 1 illustrates a layout schematic view of a general array substrate for display panel.

FIG. 1 illustrates a layout schematic view of a general array substrate for display panel. It can be seen from FIG. 1, the array substrate includes a display region 1 and a drive circuit region 2. The display region 1 contains a gate, a source/drain, an insulation layer, an active layer, and also is called as a pixel display area. The portion outside of the display region 1 is called as a drive circuit region 2. The drive circuit region 2 is disposed with GOA units, and a wire connecting the GOA unit to the display region and a wire for transporting external signals. The GOA unit mainly plays a role of circuit driving, and normally has a gate electrode layer, an insulation layer, an active layer and a source/drain electrode layer, a passivation layer, etc. Therein, the gate electrode layer and the source/drain electrode layer are normally made by metal material, and the insulation layer is normally formed by silicon nitride or other similar material, and the active layer is normally made by semiconductor material and for example comprises two layers made by a-Si and n+ a-Si materials respectively.

Figure 2:
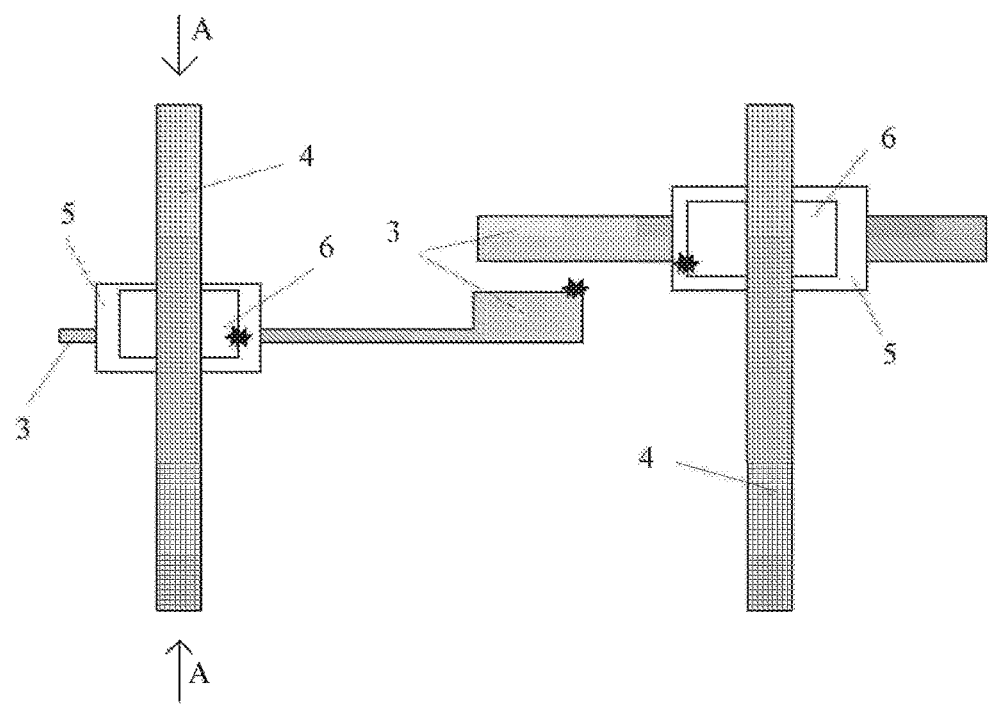
FIG. 2 illustrates a schematic view of a drive circuit region in an array substrate in prior art.
Figure 3:
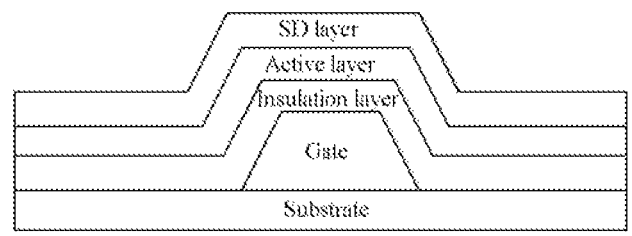
FIG. 3 illustrates a schematic partial section view of the drive circuit region in the array substrate in prior art taken along an arrow A-A in FIG. 2.

FIG. 2 illustrates a schematic plane view of a drive circuit region in an array substrate in prior art. FIG. 2 is an enlarged schematic view of a circled location in FIG. 1. Therein, the gate and source/drain connect to the GOA unit, and the reference sign "3" represents a gate metal wire outgoing from pixels in the display region and connecting to the GOA unit through vias, jumpers. The drive circuit region 2 has a gate wire 3 connecting to the gate electrode layer in the GOA unit and a source/drain layer wire 4 at the same layer with the source/drain electrode layer. Since there is a difference in altitude between the gate wire 3 and the source/drain layer wire 4, a pad layer (or called as a climbing layer) is needed to be arranged between the two when the two intercross with each other. And for the simplicity of the process, a regular approach in the art is normally employing the gate insulation layer 5 (it is normally formed by silicon nitride) and the active layer 6 formed in the manufacturing process of GOA circuit as the pad layer, which can be seen clearly in FIG. 3. FIG. 3 illustrates a schematic partial section view of the drive circuit region in the array substrate in prior art taken along an arrow A-A in FIG. 2. However, the inventor found that when there is an active layer (comprising Amorphous Silicon) formed between the two wires, the conductivity performance of the semiconductor material in the active layer will increase under high temperature, which is a key factor of inducing electrostatic discharge. Therefore, when the metal wire connecting to the gate is too thin or arranged too intensively, and overlaps with or is very close to the Amorphous Silicon (that is a-Si) in the active layer, the electrostatic breakdown between the gate wire and the source/drain layer wire will be caused usually, resulting in abnormal display of picture. The star markers in FIG. 2 schematically show the weak positions at which ESD is easy to occur, that is a high-incidence area of ESD.

Figure 4:
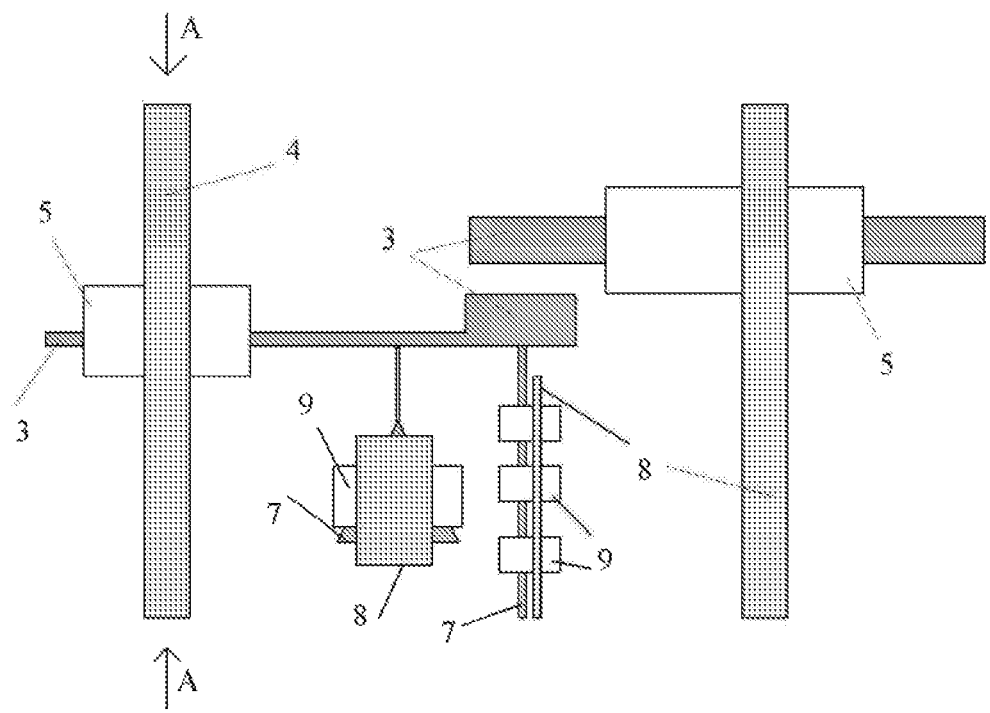
FIG. 4 illustrates a schematic plane view of a drive circuit region in an array substrate according to the application.
Figure 5:
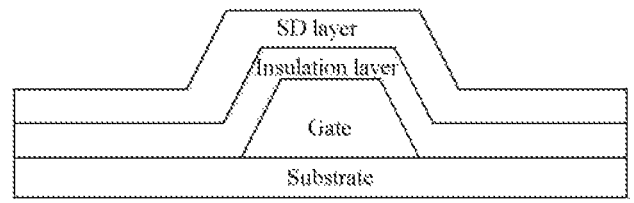
FIG. 5 illustrates a schematic partial section view of the drive circuit region in the array substrate according to the application taken along an arrow A-A in FIG. 4.

FIG. 4 illustrates a schematic plane view of a drive circuit region in an array substrate according to the application. It can be seen from FIG. 4, there is only an insulation layer 5 existing between the gate wire 3 and the source/drain layer wire 4, and there is no an active layer. Therefore, the area between the portions of the gate wire 3 and the source/drain layer wire 4 which intercross with each other would not become a semiconductor switch due to the presence of the active layer. This largely reduces the possibility of ESD occurring at the positions of the 3 and the 4 intercrossing with each other and at nearby positions, and thus changes them into a non high-incidence area of ESD. This can be seen more clearly in the section view of FIG. 5 (which illustrates a schematic partial section view of the drive circuit region in the array substrate according to the application taken along an arrow A-A in FIG. 4). Although there is no an active layer between the portions of the gate wire 3 and the source/drain layer wire 4 which intercross, an insulation layer 5 is present therebetween, which can also realize the function of the pad layer, and thus can not affect the intercross between the gate wire 3 and the source/drain layer wire 4. This can also be seen from the section view of FIG. 5. Besides, the removal of the active layer 6 does not need an additional process, and only needs improvement of an mask pattern for forming an active layer 6 on the substrate. Therefore, such improvement has a low cost. It should be noted that, although two examples of the dummy discharge region is given out in FIG. 4, the two examples are only exemplary forms, and does not consist an limitation to the invention. Further, the structures shown in FIGS. 4 and 5 are only schematic, the relative sizes and structures of the elements may be different according to actual conditions.

According to a preferable embodiment, the portions of the gate wire 3 and the source/drain layer wire 4 which intercross may be wider than the wire in the surrounding area. This further reduces the probability of the ESD occurring at the cross portions.

Besides, according to a further embodiment, the array substrate according to the application further provides a discharge-inducing region in a free area in the drive circuit region. The discharge-inducing region as the name implies is an area at which the ESD is induced to occur actively. Therein, the discharge-inducing region comprises a layer of dummy electrode portion 7 connecting to the gate wire, another layer of dummy electrode portion 8 at the same layer with the source/drain layer wire, and an insulation layer and active layer (shown schematically by the reference sign 9) formed between the two dummy electrode portions. The above layers overlap with each other. Thus the discharge-inducing region forms a structure similar to that of the thin film transistor and becomes a high-incidence region of ESD. Since the high-incidence region of ESD is arranged near the actual active wires, the ESD can be induced to occur at the discharge-inducing region, that is, the static electricity in the surrounding area is made to release at the discharge-inducing region. This indirectly reduces the possibility of the ESD occurring at the area of actual active wires. Since the electrode in the discharge-inducing region is the dummy electrode portion, the electrostatic discharge in this area would not result in damage of the active wire portions. For example, even if the electrostatic discharge at the discharge-inducing region causes the dummy electrode portion connecting to the gate wire or the source/drain layer wire to break off, it would not affect the normal operation of the actual active wire at surrounding area.

According to a preferable embodiment, the dummy electrode portion at the discharge-inducing area may have a shape with a tip. For example, it may has a shape of triangle, rectangle or prismatic etc. Alternatively, the dummy electrode portion may be two wires parallel to each other (including a wire connecting to the gate wire 3 and another wire at the same layer with the source/drain layer wire), and the two wires are thin enough and close to each other enough to become a high-incidence region of ESD, as shown in FIG. 4 schematically. Additionally, the dummy electrode portion 7 connecting to the gate wire 3 and the dummy electrode portion 8 at the same layer with the source/drain wire 4 may have different shapes. Although the dummy electrode portions 7 and 8 are shown as overlapping with each other in FIG. 4, the case that they overlap with each other partially or are close to each other would also realize the purpose of the application. Preferably, the dummy electrode portion at the discharge-inducing region has a thinner or more intensive structure than the actual active wire around it. It should be noted that, the insulation layer and the active layer 9 at the discharge-inducing region as shown in FIG. 4 are of exemplary shapes, and may have shapes which are same or similar with the dummy electrode portion or any other shapes which is sandwiched between the two layers of dummy electrode portions.

According to a preferable embodiment, the dummy electrode portion has a weak area, which is easy to break off when an ESD event occurs. By arranging a weak area in the dummy electrode portion, the weak area can be made to directly break off, that is to be burned out, when the ESD occurs in the discharge-inducing region, thus minimizes the effect of the ESD event.

Apparently, there may be more than one discharge-inducing region, which can be distributed at various free locations in the drive circuit region as required.

It is clear for those skilled in the art that, the above various components in the array substrate may be formed by steps of deposition, coating photoresist, masking exposure and development etc. or other known processes in the art, which are not the focus of the invention and the detailed description of which will be omitted herein.

Figure 6:
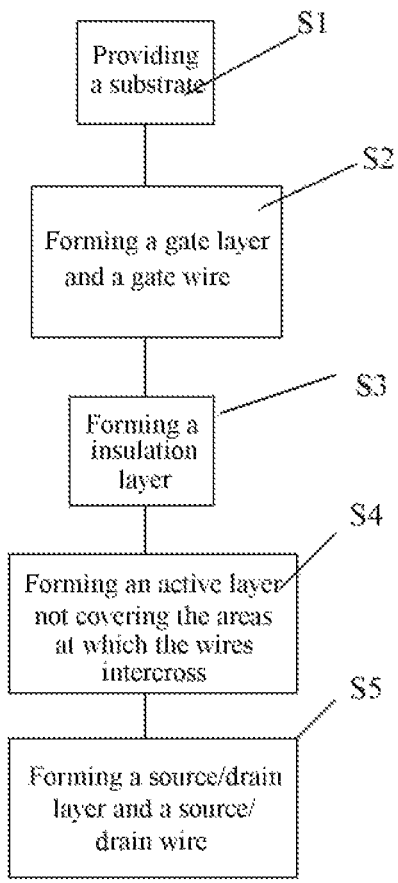
FIG. 6 illustrates a manufacturing method of the array substrate according to the application, wherein several basic steps are illustrated.

FIG. 6 schematically shows a manufacturing method of an array substrate according to the application. Therein, at step S1, a substrate is provided. At step S2, a gate electrode layer and a gate wire connecting to the gate electrode layer is formed on the substrate. At step S3, an insulation layer is formed on the substrate formed with the gate electrode layer and the gate wire, which insulation layer covers the gate electrode layer and the gate wire. At step S4, an active layer is formed on the insulation layer. At step S5, a source/drain electrode layer and a source/drain layer wire is formed on the substrate, wherein the active layer does not cover the area at which the gate wire and the source/drain wire intercross.

The above steps are main steps of the manufacturing method of the array substrate according to the application. According to a preferable embodiment, besides the steps listed in the figure, the manufacturing method further comprises the additional steps of: forming a discharge-inducing region in a free area around the gate wire and the source/drain layer wire, wherein a dummy electrode portion connecting to the gate wire is formed in the discharge-inducing region while the gate wire is formed, and a dummy electrode portion at the same layer with the source/drain layer wire is formed in the discharge-inducing region while the source/drain layer wire is formed, and the insulation layer and the active layer are formed between the two dummy electrode portions. It is noted that, the insulation layer and the active layer formed between the dummy electrode portions may be formed simultaneously with the insulation layer and the active layer on the gate electrode layer. Besides, the manufacturing method further comprises subsequent steps of forming a passivation layer etc. These subsequent steps are not the focus of the application, and the detailed description thereof is omitted herein.

The specific implementations of the application are described above, and the protection scope of the application is not limited to this. Any skilled person in the art may easily think of alterations or replacements within the technical scope disclosed by this application, which should be covered in the protection scope of the application. Thus, the protection scope of the application should be defined only by the protection scope of the claims.

In the description of the application, it should be understood that, the direction or position relations indicated by terms "up", "down", "inner", "outer" etc. are based on direction or position relations shown in the figures, and only for facilitating and simplifying description of the application, and do not intended to indicate or imply the device or element referred to must have specific directions, construct or operate in specific directions, and thus can not be understood as limitation of the application. Besides, although in the method claims various steps are listed in some order, these steps is not necessarily performed in the listed order, and on the contrary may be performed in a opposite or parallel way without departing from the sprit and gist of the invention. The word "comprising" does not exclude other elements or steps which are not listed in the claim. The indefinite article "a" or "an" preceding an element does not exclude the presence of a plurality of such elements. The mere fact that certain measures are recited in mutually different dependent claims does not indicate that a combination of these measures cannot be used to advantage. Any reference signs in the claims should not be construed as limiting the scope.

The invention claimed is:

1. An array substrate comprising: a display region and a drive circuit region;

wherein the drive circuit region comprises GOA units and wires connecting the GOA units to the display region, the GOA unit comprises a substrate, a gate electrode layer, an insulation layer, an active layer and a source/drain electrode layer, and the drive circuit region further comprises a gate wire connecting to the gate electrode layer, and a source/drain layer wire at the same layer with the source/drain electrode layer, wherein the area between the portions of the gate wire and the source/drain layer wire which intercross with each other is only formed with the insulation layer.

2. The array substrate according to claim 1, wherein the portions of the wires which intercross with each other are wider than the wires at surrounding area.

3. A display apparatus comprising the array substrate according to claim 2.

4. The array substrate according to claim 1, wherein in an free area around the portions of the wires which intercross with each other, a discharge-inducing region is formed, which region is formed with a dummy electrode portion at the same layer with the source/drain layer wire, a dummy electrode portion connecting to the gate wire, and an insulation layer and an active layer formed between the two dummy electrode portions.

5. The array substrate according to claim 4, wherein the dummy electrode portion has a shape with a tip.

6. The array substrate according to claim 5, wherein the dummy electrode portion has a shape of triangle, rectangle or prismatic.

7. The array substrate according to claim 6, wherein the dummy electrode portion has a weak area, which is easy to break off when an ESD event occurs.

8. A display apparatus comprising the array substrate according to claim 6.

9. The array substrate according to claim 5, wherein the dummy electrode portion has a weak area, which is easy to break off when an ESD event occurs.

10. A display apparatus comprising the array substrate according to claim 5.

11. The array substrate according to claim 4, wherein the dummy electrode portion at the same layer with the source/drain layer wire and the dummy electrode portion connecting to the gate wire are two wires extending approximately parallel to each other, and the distance between the two wires is small enough to induce ESD.

12. The array substrate according to claim 11, wherein the dummy electrode portion has a weak area, which is easy to break off when an ESD event occurs.

13. The array substrate according to claim 4, wherein the dummy electrode portion has a weak area, which is easy to break off when an ESD event occurs.

14. A display apparatus comprising the array substrate according to claim 4.

15. A display apparatus comprising the array substrate according to claim 1.

* * * * *